United States Patent [19]
Hshieh et al.

[11] Patent Number: 5,821,583
[45] Date of Patent: Oct. 13, 1998

[54] TRENCHED DMOS TRANSISTOR WITH LIGHTLY DOPED TUB

[75] Inventors: Fwu-Iuan Hshieh, Saratoga; Lih-Ying Ching, Cupertino; Hoang Tran, San Jose; Mike F. Chang, Cupertino, all of Calif.

[73] Assignee: Siliconix incorporated, Santa Clara, Calif.

[21] Appl. No.: 610,563

[22] Filed: Mar. 6, 1996

[51] Int. Cl.⁶ ................................................. H01L 29/78
[52] U.S. Cl. ............................................................ 257/330
[58] Field of Search ................................. 257/330, 331, 257/332, 333, 334, 329; 438/270

[56] References Cited

U.S. PATENT DOCUMENTS

| | | | |
|---|---|---|---|
| 4,931,408 | 6/1990 | Hshieh | 437/44 |
| 5,168,331 | 12/1992 | Yilmaz | 257/331 |
| 5,304,831 | 4/1994 | Yilmaz et al. | 257/341 |
| 5,316,959 | 5/1994 | Kwan et al. | 437/40 |
| 5,341,011 | 8/1994 | Hshieh et al. | 257/330 |
| 5,380,670 | 1/1995 | Hagino | 438/270 |
| 5,404,040 | 4/1995 | Hshieh et al. | 257/341 |
| 5,410,170 | 4/1995 | Bulucea et al. | 257/330 |
| 5,429,964 | 7/1995 | Yilmaz et al. | 437/41 |
| 5,465,000 | 11/1995 | Williams | 257/335 |
| 5,468,982 | 11/1995 | Hshieh et al. | 257/331 |
| 5,474,943 | 12/1995 | Hshieh et al. | 437/40 |
| 5,479,037 | 12/1995 | Hshieh et al. | 257/328 |
| 5,486,772 | 1/1996 | Hshieh et al. | 324/769 |
| 5,521,409 | 5/1996 | Hshieh et al. | 257/341 |
| 5,532,179 | 7/1996 | Chang et al. | 437/40 |
| 5,558,313 | 9/1996 | Hshieh et al. | 257/342 |
| 5,688,725 | 11/1997 | Darwish et al. | 438/270 |
| 5,689,128 | 11/1997 | Hshieh et al. | 257/329 |
| 5,714,781 | 2/1998 | Yamamoto et al. | 257/329 |

FOREIGN PATENT DOCUMENTS 56-58267  5/1981  Japan.

Primary Examiner—David B. Hardy
Attorney, Agent, or Firm—Skjerven, Morrill, MacPherson, Franklin & Friel LLP; Norman R. Klivans

[57] ABSTRACT

A trenched DMOS transistor has significantly reduced on-resistance. A lightly doped P tub is formed surrounding the P+ body region in order to enhance avalanche breakdown. Thus the epitaxial layer resistivity can be decreased to reduce device on-resistance, while the desired breakdown voltage is also achieved. The on-resistance is further reduced by adding a pre-initial oxidation implant, i.e. phosphorous for an N channel device or boron for a P channel device. This forms a more heavily doped JFET or pinch region at the bottom of the trench and in the upper portion of the drift region. This N JFET region (which is P doped for a P channel device) is more heavily doped than the underlying epitaxial layer and surrounds the trench bottom, thus reducing on-resistance by increasing local doping concentration where otherwise a parasitic JFET would be present.

7 Claims, 3 Drawing Sheets

TRENCHED DMOS TRANSISTOR WITH LIGHTLY DOPED TUB

BACKGROUND OF THE INVENTION

1. Field of the Invention

This invention relates to integrated circuit structures and power transistor structures and more particularly to a DMOSFET with reduced on-resistance.

2. Description of the Prior Art

Power MOSFET (metal oxide semiconductor field effect transistor) devices are widely known for applications such as automobiles, electrical systems, power supplies and power management. In a trenched DMOS transistor, the gate electrode is a conductive material, typically polycrystalline silicon (polysilicon) located in a trench in a transistor substrate, where the side walls and bottom of the trench are insulated with silicon dioxide. The trenched structure increases transistor density, i.e. reduces the surface area consumed by the polysilicon gate electrode of each transistor. Typically such transistor are used in lower voltage applications where a transistor includes a large number (thousands) of cells. Each cell is defined by a source region diffused into the substrate and by the gate electrode trenches.

The use of the trenches advantageously also reduces the undesirable parasitic JFET (junction field transistor) region which typically is present between adjacent transistors. This resistance is also called the $R_{dson}$ (drain-source on-resistance) and is the resistance when the transistor is in its conductive state. It is desirable to minimize the on-resistance.

At the same time, the breakdown voltage of a MOSFET must be maximized. Breakdown voltage is the maximum sustainable voltage above which destructive breakdown occurs at the bottom of the trench into the underlying drain region, due to an excessive local electrical field. Typically trenched MOSFETs are fabricated so that a P+ doped deep body region extends deeper into the substrate than does the bottom of the trench. Thus rather than having destructive breakdown at the trench bottom or corners, instead a non-destructive avalanche breakdown occurs from the lowest portion of this P+ deep body region into the underlying drain region. However, it is desirable to even further reduce on-resistance while maintaining a sufficiently high level of breakdown voltage.

U.S. Pat. No. 5,304,831 issued Apr. 9, 1994, to Hamza Yilmaz and commonly owned, incorporated herein by reference in its entirety, discloses in the context of a planar (non-trenched) MOSFET the realization of a reduced drain-source on-resistance. The disclosed structure with a shallow P body region, P tub, and P+ diffusions results in reduced channel resistance and reduced JFET resistance.

Present FIG. 1 is a redrawn version of FIG. 17a from that patent. The reference numbers have been changed and the topside interconnect structure simplified in present FIG. 1 to emphasize the relevant aspects. The N+ doped substrate (drain) region 12 is overlain by an N− doped epitaxial layer 14. Epitaxial layer 14 is a heavily doped P+ body region 18 which is surrounded by a more lightly doped P tub region 16. This lightly doped P tub region 16 is a lightly dosed diffusion which is strongly driven in, to a depth of 2.5 to 5 $\mu$m.

The remainder of the structure of FIG. 1 is conventional, including the N+ doped source regions 20, the gate oxide layer 22, the gate electrode 24, and insulating layer 26 over the gate electrode, BPSG layer 28, and a passivation layer 32.

There is still a need for improved (reduced) drain-source on resistance for trenched DMOS transistors.

SUMMARY

The drain-source on-resistance of a DMOSFET is reduced by providing a lightly doped P tub region surrounding the P+ body region, in order to enhance avalanche breakdown. Therefore, the resistance of the underlying epitaxial layer (drift region) is decreased, to achieve overall reduced device on-resistance. At the same time, the desired breakdown voltage can be achieved. In another embodiment the on-resistance is further reduced by adding a pre-initial oxidation implant, i.e. phosphorus for an N channel device or boron for a P channel device. By providing this additional implant, an N JFET or pinch region (or a P region for a P channel device) which is more heavily doped than the underlying the N− doped epitaxial layer (drift region) is formed around the trench bottom and overlying the drift region. Thus, the on-resistance is reduced by increasing doping concentration at the areas where the parasitic JFET would form, i.e. immediately underneath and at the bottom corners of the trench.

DETAILED DESCRIPTION OF THE PREFERRED EMBODIMENT

Figure 1:
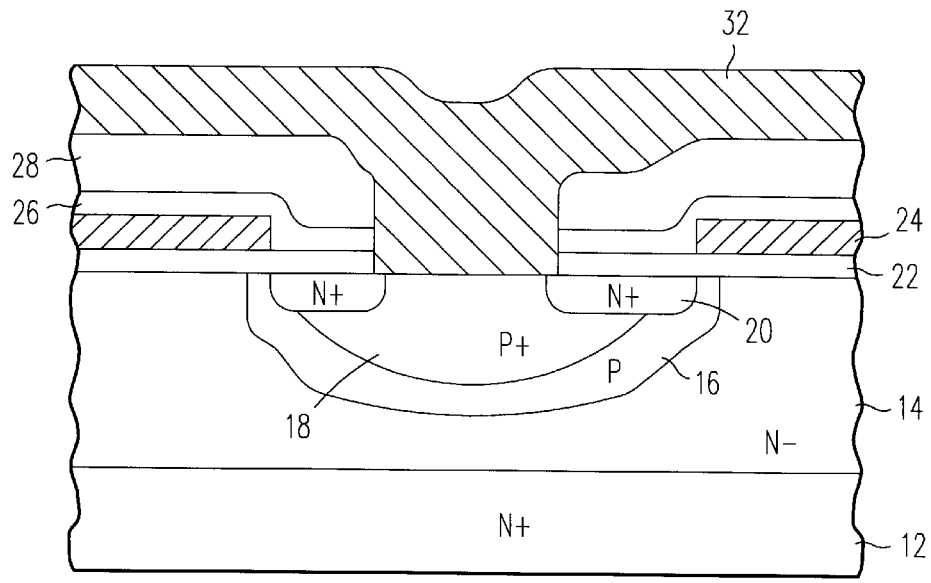
FIG. 1 shows a cross section of a prior art planar DMOSFET transistor having a P tub surrounding the body region.
Figure 2:
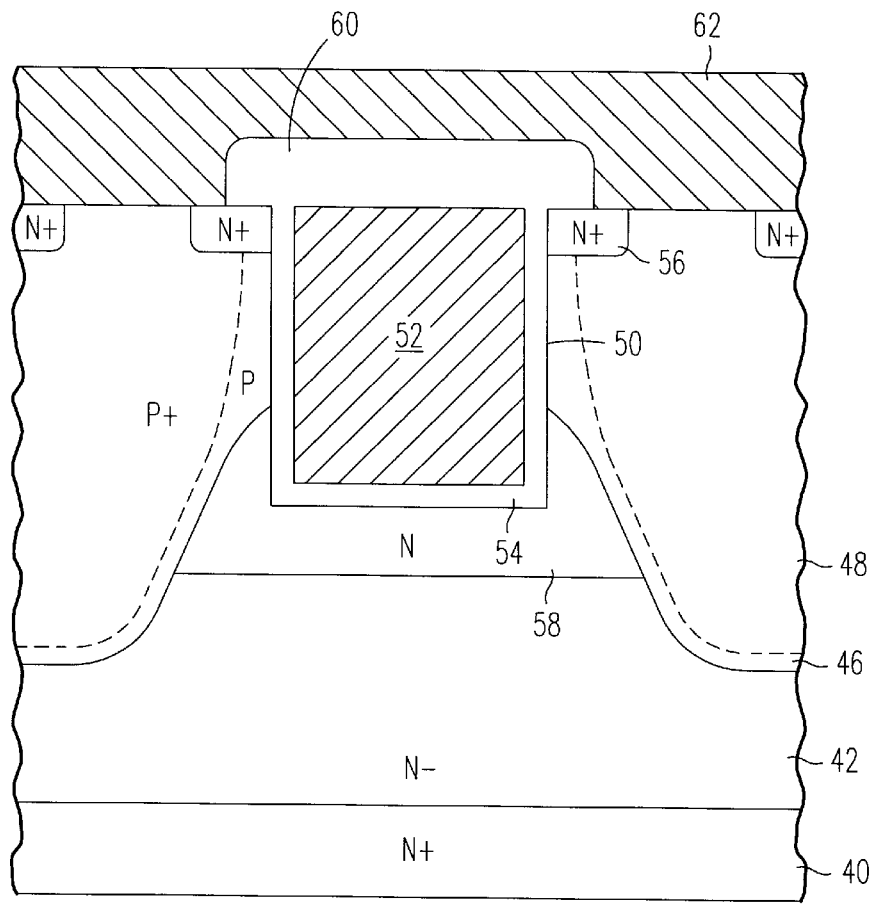
FIG. 2 shows a cross section of a trenched DMOSFET in accordance with the present invention.

FIG. 2 shows in cross-section a transistor (DMOSFET) in accordance with the present invention. It is to be understood that this cross-section is dawn conventionally showing a portion of several cells of a typical transistor which may include thousands of such cells. However, a single cell transistor is also possible. Also while the present disclosure is directed to a transistor having a negatively (N) doped substrate, a positively (P) doped body region and an N doped source region, it is to be understood that complementary devices are also possible, wherein each dopant is reversed in terms of conductivity type.

Also, the cross-sections shown here are not drawn to scale, but are intended to be illustrative. While the various transistor doped regions are shown here conventionally delineated by lines, this is illustrative rather than representative. In the figures, identical reference numbers used in various figures denote similar or identical structures. Also, the various parameters disclosed for junction depths, thicknesses, widths, doping concentrations, dosages and implantation energies are illustrative rather than limiting. Various materials may be used for the positive and negative type dopants. While the substances conventionally used for these doping types may be used, this is not limiting.

FIG. 2 therefore shows a cross-section of one cell, with small portions of adjoining cells, of the present transistor which includes a drain region 40 which is N+ doped so as to have a resistivity of 1 to 10 milliohm•cm and being of conventional thickness. A conventional metallized drain electrode (not shown) is formed on the bottom surface of drain region 40 as an electrical contact thereto. Grown on the drain region 40 (substrate) is an N− doped epitaxial layer, the N− doped portions of which are designated 42. It is understood that region 42 may be formed other than by epitaxy. N– drift region 42 has a resistivity of 0.7 to 1.0 milliohm•cm. The epitaxial layer has a total thickness of 8 to 12 μm.

A P doped tub 46 is formed in the upper portion of the semiconductor body. A typical doping level of P tub region is $1\times10^{16}$ to $1\times10^{17}/cm^3$. Thus, this is a relatively lightly doped region. A typical junction depth for the P tub 46 is 3 μm; a typical range is 2 to 4 μm. Formed inside the P doped tub 46 is the P+ doped body region 48. A typical doping level of the body region 48 is $1\times10^{18}/cm^3$ to $5\times10^{18}/cm^3$. Included as part of the P+ doped body region 48 is a lower P+ deep body portion at the lower portion of the body region. A typical junction depth of the P+ body region is 2.5 μm so as to be approximately 0.5 μm shallower than the surrounding P doped tub region 46.

Penetrating downward from the principal surface of the semiconductor body is a set of trenches; one such trench 50 is illustrated. Trench 50 is lined, as are the others, by a gate oxide layer 54 which is typically 0.05 to 0.07 μm thick, and each trench is conventionally filled with a conductive doped polysilicon gate electrode gate 52. Typically the P+ body region extends 0.5 μm below the bottom of the trench 50.

An additional region of the transistor of FIG. 2 (which is optional in accordance with the present invention) is N doped region 58 which underlies the trench 50 and also extends along the lower portion of the side walls of trench 50. Region 58 is called a JFET or pinch region.

N doped region 58 advantageously further reduces the on-resistance of this transistor by creating a more heavily doped area at the lower side walls and bottom of the trench, compared to the underlying epitaxial drift region 42. Thus, this further reduces on-resistance by increasing the doping concentration in this region, which is typically where the parasitic JFET would form. A typical doping concentration of N doped region 58 is $1\times10^{15}/cm^3$. This doping concentration is optimized to maximize the trade-off between breakdown voltage and on-resistance. A typical thickness of N region 58 is about 0.5 μm. (This is the thickness between the floor of trench 50 and the uppermost portion of the underlying drift region 42.)

Formed in the upper portion of the transistor are N+ doped source regions 56 having a typical junction depth of 0.5 μm. A typical doping level of the N+ source regions 56 is about $6\times10^{19}/cm^3$ at the principal surface.

Insulating the upper portion of each conductive gate electrode 52 is a BPSG (boro-phosphosilicate glass) insulating layer 60 which is conventional and which is overlain by a body-source metalized layer 62.

It is to be understood that the depiction herein is only of a small portion of the active part of the transistor. Each transistor active part is surrounded by a termination at the principal surface of the semiconductor body, the termination typically including doped regions and sometimes a trench. Conventional terminations are suitable for use in accordance with the present invention, and hence the termination is not illustrated or further described herein.

A typical width of each trench is 0.8 to 1.0 μm. A typical cell pitch is 10 μm but this is only illustrative. The cells may be of any one of various configurations.

An exemplary process flow for fabricating the transistor of FIG. 2 is described hereinafter. It is to be understood that this process flow is not the only way to fabricate this structure but is illustrative. Also, the various parameters provided herein may be varied and still result in a structure and process in accordance with the present invention.

Figure 3A:
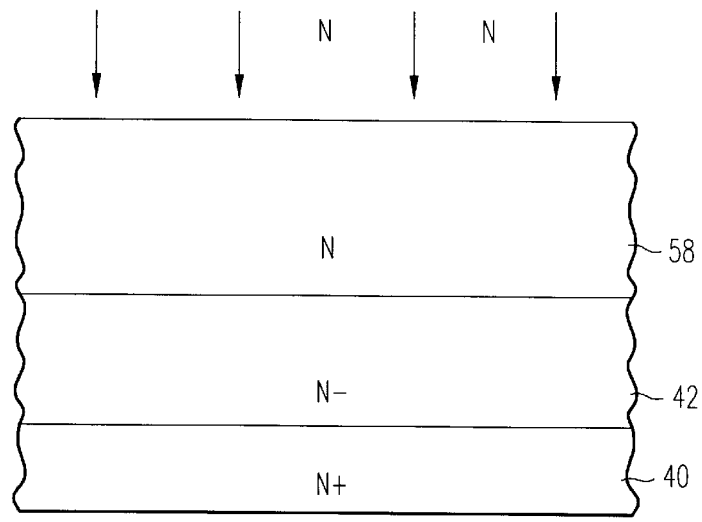
FIGS. 3A through 3E show steps fabricating the transistor of FIG. 2.

One begins at showing of FIG. 3*a* with an N+ doped substrate 40 conventionally fabricated to have a resistivity in the range of 1 to 10 milliohm•cm. An N– doped epitaxial layer 42 is then grown thereon having a resistivity in the range of 0.7 to 1.0 milliohm•cm and a thickness of 6 to 11 μm. As shown in FIG. 3A, the upper portion of epitaxial layer 42 is then more heavily doped using an N type blanket implant to a final doping level of e.g. $1\times10^{15}/cm^3$. (One of ordinary skill in the art can readily determine the requisite energy levels and dosages to achieve this and the other doping concentrations disclosed herein.) This implantation step is optional, but if used is optimized to maximize the trade-off between breakdown voltage and on-resistance.

Figure 3B:
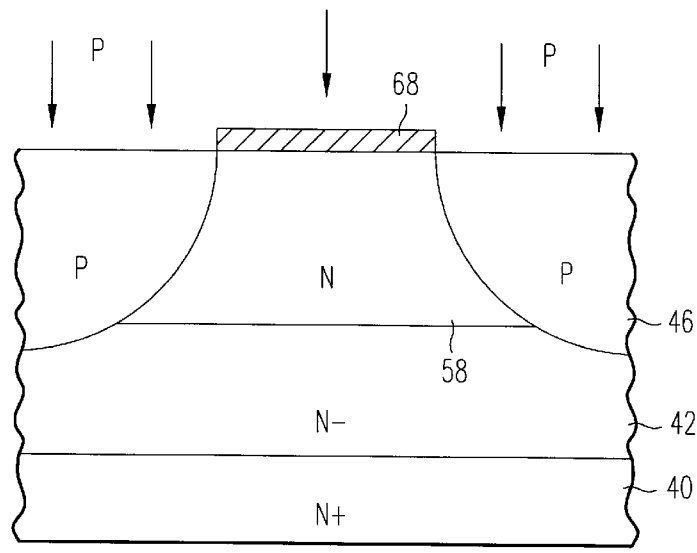

Then in FIG. 3B a conventional masking layer is deposited and patterned to define the remaining portion 68. This mask layer 68 which is used to mask off subsequent the P type implant which forms the P tub regions 46. This P implant results in a final P doping concentration in the range of $10^{16}$ to $10^{17}/cm^3$, after a relatively long diffusion takes place at high temperature in order to drive in this P tub diffusion to a junction of 2 to 4 μm. This same step also drives in the previous N implant, which forms region 58 to a depth of 1 to 3 μm.

Figure 3C:
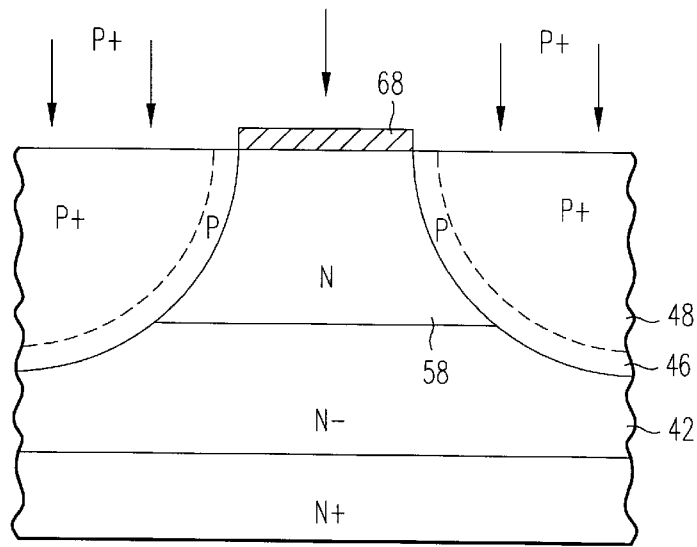
Figure 3D:
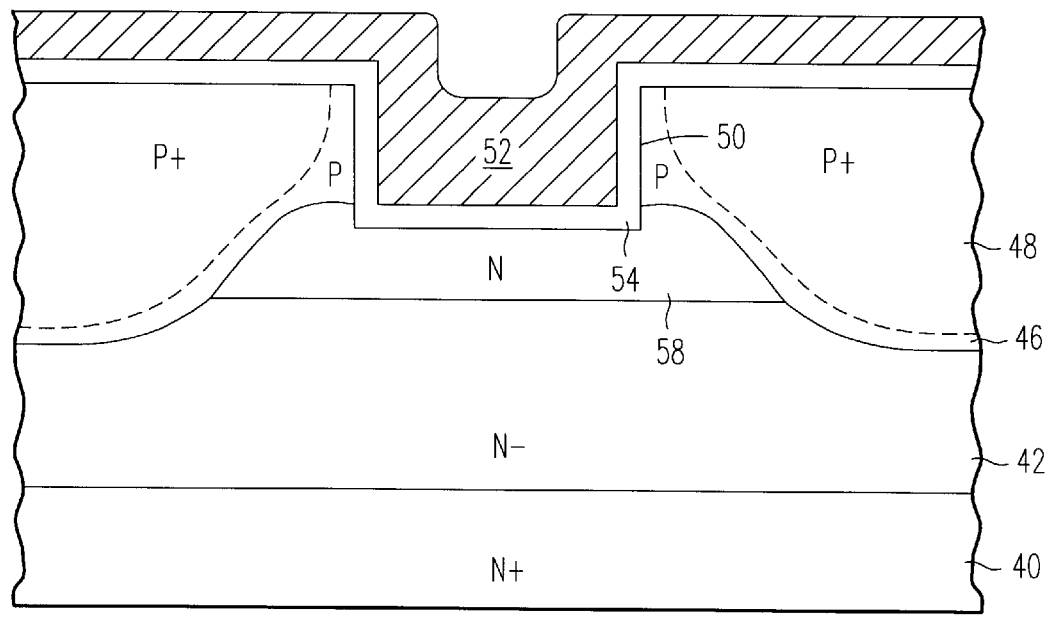

Then as shown in FIG. 3C, using the same masking layer 68, a P+ implant forms the P+ regions 48. Alternatively instead of a boron implant, this may be a boron nitride or boron diffusion. This P+ implant results in a final doping concentration of 1 to $5\times10^{18}/cm^3$. As can be seen, the P tub region 46 surrounds (i.e. has a junction depth deeper than) the P+ region 48 after all drive in steps are completed.

The remainder of the steps to fabricate the transistor are conventional. In the next step the principal surface of the semiconductor body has a conventional active mask layer formed thereon and patterned. This active mask may be oxide or other suitable material. This active mask defines the active portion of the transistor and hence masks off the transistor termination. It is to be understood that in the embodiments depicted herein only the active portion is shown, with the termination being outside the area of the drawing.

A trench mask layer is then formed and patterned (not shown). Using the trench mask as a pattern, the trenches 50 are then etched anisotropically. The trenches are then subject to a sacrificial oxide step to smooth their sidewalls and bottoms. The gate oxide layer 54 is then grown conventionally to a thickness of 0.05 to 0.07 μm. A layer of polysilicon 52 is then formed on the principal surface of the semiconductive body and filling all the trenches. The polysilicon layer 52 is then doped to achieve maximum conductivity with an N type dopant (this step is not shown).

Then a gate mask layer (polymask) is formed over the entire surface of the polysilicon, and patterned. The gate mask layer is then used to etch away the polysilicon except from the trenches while also leaving contact fingers on the principal surface connecting the gate electrodes in the various trenches (not shown).

Figure 3E:
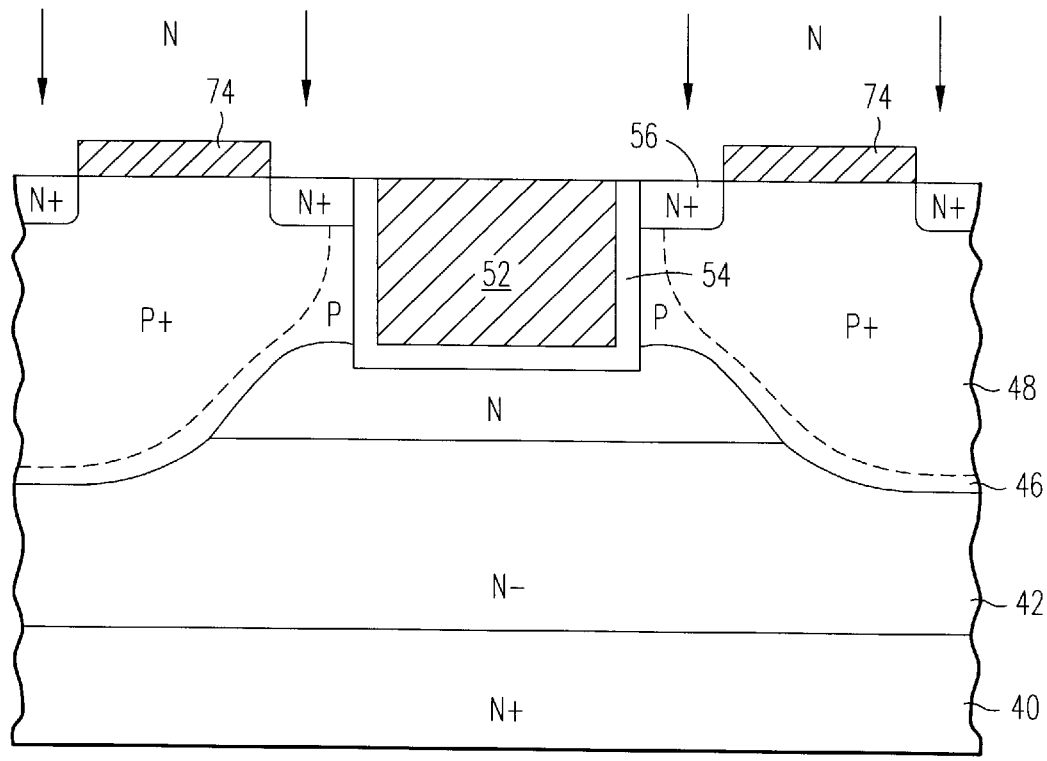

Then in FIG. 3E a source blocking mask 74 is formed on the principal surface of the substrate to define the regions where the source regions are to be formed. This masking layer 74 is conventionally patterned and then an N+ implant is carried out to define the N+ source regions 56. The N+ source implant, the dopant being arsenic conventionally, results in a doping concentration of about $6\times10^{19}/cm^3$. The N+ source mask layer 74 is then stripped.

The following steps are conventional to complete the transistor. A layer of boro-phosphosilicate glass (BPSG) is conventionally deposited to a thickness of 1 to 1.5 µm and doped. A BPSG mask layer is then formed and patterned over the BPSG layer and then the BPSG mask layer is used to etch the BPSG, defining the BPSG regions 60 of FIG. 2 insulating the top side of each conductive gate electrode 52.

Then the BPSG mask layer is stripped, and a source-body metal layer is deposited and masked to define the source-body metallization contacts 62 of FIG. 2. Then a passivation layer is formed and a pad mask is formed and patterned and use to define the pad contacts through the passivation layer (not shown). It is to be understood that the formation of the metal layer 62 has a corresponding step to form the contact to drain region 40 (not shown) on the back side of the substrate. This completes the transistor.

This disclosure is intended to be illustrative and not limiting; further variations and modifications will be apparent to one skilled in the art in light of this disclosure and are intended to fall within the scope of the appended claims.

We claim:

1. A transistor structure comprising:
   a substrate of a first conductivity type;
   a drift region overlying the substrate and of the first conductivity type, being doped to a lower doping concentration than the substrate;
   a tub region of a second conductivity type opposite to the first conductivity type, and extending from a principal surface of the transistor structure into the drift region;
   a body region of the second conductivity type in the tub region, and being doped to a higher concentration than the tub region, extending from the principal surface into the drift region to a depth less than that of the tub region;
   a conductive gate electrode extending from the principal surface to a lesser depth than that of the tub region; and
   a source region of the first conductivity type, and extending from the principal surface into the body region; and
   a pinch region of the first conductivity type, and of a higher doping concentration than the drift region, and located adjacent a lower portion of the gate electrode, wherein a lateral and upper extent of the pinch region are defined by the tub region, and the tub region and body region extend into the substrate from the principal surface to a depth greater than that of the pinch region.

2. The transistor structure of claim 1, wherein a depth of the tub region is about 0.5 µm greater than a depth of the body region.

3. The transistor structure of claim 1, wherein a depth of the tub region from the principal surface is at least 2.5 µm.

4. The transistor structure of claim 1, wherein a doping concentration of the body region is at least 10 times that of the tub region.

5. The transistor structure of claim 1, wherein a doping concentration of the tub region is less than $1 \times 10^{17}/cm^3$.

6. The transistor structure of claim 1, wherein the pinch region extends adjacent the sides and bottom of the gate electrode, and is spaced apart from the substrate by an intervening portion of the drift region.

7. The transistor structure of claim 1, wherein the tub region laterally surrounds the body region.

\* \* \* \* \*